United States Patent
Girard et al.

(10) Patent No.: US 6,716,764 B1
(45) Date of Patent: Apr. 6, 2004

(54) METHOD OF FORMING FIRST LEVEL OF METALLIZATION IN DRAM CHIPS

(75) Inventors: Christophe Girard, Acheres-la-Foret (FR); Renzo Maccagnan, Villabe (FR); Stephane Thioliere, Paris (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/573,379

(22) Filed: May 18, 2000

(30) Foreign Application Priority Data

May 20, 1999 (EP) .............................. 99480034

(51) Int. Cl.[7] .............................. H01L 21/302
(52) U.S. Cl. .................. 438/714; 438/201; 438/275; 438/710; 438/725; 438/241; 438/253; 438/256; 438/258
(58) Field of Search ................................ 438/201, 275, 438/241, 253, 256, 258, 710, 714, 725, 692

(56) References Cited

U.S. PATENT DOCUMENTS 6,258,727 B1 * 7/2001 Maccagnan .................. 438/714

* cited by examiner

*Primary Examiner*—George Goudreau
(74) *Attorney, Agent, or Firm*—Margaret A. Pepper

(57) ABSTRACT

There is disclosed a method of forming contacts and metal lands onto a semiconductor structure at the first level of metallization (M0). The initial structure is a silicon substrate having diffusion regions formed therein and a plurality of gate conductor stacks formed thereon. The structure is passivated by an insulating layer. Contact holes of a first type are etched in the insulating layer to expose some diffusion regions, then filled with doped polysilicon to form conductive studs substantially coplanar with the insulating layer surface. A first mask (M0) is formed at the surface of the structure to expose M0 land recess locations including above said studs. The masked structure is anisotropically dry etched to create M0 land recesses. Next, the M0 mask is removed. A second mask (CS) is formed at the surface of the structure to expose desired contact hole locations of a second type. The masked structure is again anisotropically dry etched to expose the diffusion regions and the top of gate conductor stacks. The CS mask is removed. Finally, said M0 land recesses and contact holes are filled with a metal, so that the metal and the insulating material top surface are substantially coplanar.

13 Claims, 16 Drawing Sheets

METHOD OF FORMING FIRST LEVEL OF METALLIZATION IN DRAM CHIPS

FIELD OF THE INVENTION

The present invention relates to the manufacture of semiconductor integrated circuits (ICs) and more particularly to a new method of forming contacts and metal lands at the first level (M0) of metallization to significantly improve device performance.

BACKGROUND OF THE INVENTION

In the manufacture of semiconductor integrated circuits and particularly in dynamic random access memory (DRAM) chips, the metal interconnect at the first level, referred to herein below as the M0 level, is extensively used to address memory cells of the chip. In essence, it is used to make contacts with the diffusion regions (drain/source) of all the insulated gate field effect transistors (IGFETs) driven by the same bit line (BL) and to interconnect the gate conductors of all the IGFETs driven by a same word line (WL) to their respective driving IGFET at the chip periphery. Each bit line consists of a metal land which is formed at the M0 photolithography level.

The essential steps of a conventional contact and metal land fabrication process will be briefly described by reference to FIG. 1 and FIGS. 2A–2I. After these steps been completed, the contacts and metal lands at the first level of metallization (M0 interconnect level) and the bit lines of the DRAM chip are fabricated.

FIG. 1 schematically illustrates a state-of-the-art semiconductor structure 10, which is a part of a wafer at the initial stage of the formation process. Structure 10, is basically comprised of a silicon substrate 11, with N+ and P+ diffusion regions 12A, and 12B, respectively (generically referenced to as region 12) formed therein and a plurality of gate conductor stacks 13, on a $SiO_2$ layer forming the gate dielectric of IGFETs as standard. A gate conductor (GC) stack consists of a composite doped polysilicon/tungsten silicide ($WSi_x$)/$Si_3N_4$ cap structure. As apparent in FIG. 1, the $Si_3N_4$ cap is extended to cover the GC stack sidewall for passivation purposes, forming the so-called GC spacers. At the chip surface, two different zones are to be considered. First, the "array" wherein the memory cells are fabricated. Each elementary memory cell is comprised of an IGFET and its associated storage capacitor that is formed in a deep trench as standard. In the other zone referred to as the "support", one can find addressing and driver circuits. Structure 10, is coated with a boro-phospho-silicate-glass (BPSG) layer 14, and an overlying tetra-ethyl-ortho-silicate (TEOS) oxide layer 15. These layers are conformally deposited onto structure 10, by LPCVD as standard. As apparent in FIG. 1, structure 10, has a substantially planar surface.

Now, two types of contact holes are created depending upon their location at the structure 10, surface. First, contact holes referred to as CB holes bearing numeral 16, as clearly seen in FIG. 2A, are etched through layers 14 and 15, in the "array" area.

Now referring to FIG. 2B, a doped polysilicon layer 17, is conformally deposited onto the structure 10, to completely overfill the contact hole 16. Next, the doped polysilicon layer 17, is dry etched in a plasma until the TEOS layer 15, surface is reached. The etching is continued to produce a recess (CB recess) in the remaining polysilicon fill 17, as shown in FIG. 2C. CB recesses will be subsequently filled with metal to form lands that will be used as the bit lines of the memory cell. This over etching is determined by time and is very critical because of its sensitivity to the etch duration and thickness non-uniformities across the wafer. This over etching is carefully conducted in order not to expose the gate conductor stack 13, sidewall. If CB recess is too deep, because CB recess etch chemistry has a poor selectivity between the $Si_3N_4$ forming the GC spacer and the doped polysilicon of layer 17, the GC spacer can be partially removed exposing the $WSi_x$ material. In this case, an electrical short between bit and word lines will appear at the end of the fabrication process. The purpose of these steps is thus to produce conductive studs 17, that will subsequently allow an electrical contact between metal lands of the bit lines and N+ type diffusion regions 12A (e.g. a drain region common to two adjacent IGFETs, as illustrated in FIG. 2C) in the substrate 11.

Now, turning to FIG. 2D, structure 10, is coated first with a 90 nm thick anti-reflective coating (ARC) layer 18, which fills CB recess 16, above polysilicon stud 17, then with a 850 nm thick photo resist material 19. These chemicals are supplied by SHIPLEY, Malborough, Mass, USA, under brand names AR3 and UV2HS, respectively. After deposition, the photo resist layer 19, is baked, exposed and developed as standard to leave a patterned layer, that will be referred to herein below as the CS (Support Contact) mask. The purpose of this CS mask 19, is to define the locations of the contacts to be opened between metal lands of the first level of metallization (M0) and the diffusion regions 12B, at the surface of structure 10, in the support area.

Using the CS mask 19, contact holes are etched through layers 18, 15, 14 and the $Si_3N_4$ cap of the GC stack 13, in the support area at desired locations to expose the $WSi_x$ material of the GC stacks of IGFETs and the P+ diffusion regions 12B, of the substrate 11. These contact holes will be referred to herein below as the gate conductor contact (CG) and diffusion contact (CD) holes bearing numerals 20 and 21, in FIG. 2E, respectively. The above CS etch process chemistry has a poor selectivity to silicon, so that an undesired significant overetch of the P+ diffusion region 12B, (at the bottom of contact hole 21) is produced as clearly apparent in FIG. 2E, reducing its active section. The amount of implanted dopants in this P+ diffusion region is significantly diminished during this overetch, depleting thereby the dopant concentration therein. These two drawbacks have a great impact on diffusion region 12B, resistivity and thus on IGFET source/drain saturation current. A similar defect is also visible at the bottom of contact hole 20, but is less critical as soon as $WSi_x$ material is not completely removed.

Now, turning to FIG. 2F, structure 10, is coated again with a 90 nm thick anti-reflective coating (ARC) layer 22, which fills contact holes 16, 20 and 21, and then with a 850 nm thick photo resist material 23. Same chemicals and processes as in the previous CS mask photolithography step are used. After deposition, the photo resist layer 23, is baked, exposed and developed as standard to leave a patterned layer, that will be referred to herein below as the M0 mask 23. The purpose of this M0 mask 23, is to define the locations of metal lands of the first level of metallization at the surface of structure 10. As visible in FIG. 2F, because ARC material of layer 22, is not a good planarization medium, certain contact holes 21, will not be completely filled. Other contact holes 20, may exhibit a large void which is not critical in the extent the top of the contact hole is closed as shown in FIG. 2F.

After the M0 mask 23, has been defined, the process continues with the M0 etch process to remove 270 nm of TEOS layer 15, at locations not protected by said M0 mask 23, in two processing steps.

The first step so-called "ARC OPEN" etches the ARC layer 22, down to the TEOS layer 15, top surface. At this stage of the metal land formation process, the structure 10, is shown in FIG. 2G. As apparent in FIG. 2G, openings in M0 mask 23, have tapered sidewalls, reducing thereby the process window of the previous photolithography steps. In addition, ARC material of layer 22, at bottom of contact holes 21, is completely removed, exposing again the P+ diffusion region 12B, to the next etch step.

The second step etches about 270 nm of the TEOS layer 15, to produce the desired recesses wherein the M0 metal lands will be subsequently formed. The resulting structure is shown in FIG. 2H, where recesses are referenced 24 and 25, depending they are located in the array or support area. They will be referred to as land recesses 24/25, herein below.

Unfortunately, the above-described two-step etch process is not satisfactory. As mentioned above, the first step produces tapered contact holes because the CF4 chemistry is very sensitive to ARC layer 22, thickness variations (its thickness can vary in the 70–110 nm range across the wafer), so that land recesses 24/25, dimensional can significantly vary center-to-edge of a same wafer. This can be avoided by a very long etch duration, but at the risk of a degradation in the contact hole sidewall sharpness. Tapered land recesses 24/25, are a potential source of electrical shorts occurring between two adjacent M0 metal lands, which in turn result in a high number of failed memory cells. On the contrary, if in an attempt to avoid such shorts, said recesses are under etched, too resistive M0 metal lands would be produced. In addition, because the chemistry of the second step has different etch rates between ARC, polysilicon and TEOS materials, some similar resistance related problems in land recesses 24, could arise.

Now turning to the right part of FIG. 2H, in the support area, the sidewalls of CD and CG contact holes 20 and 21, are still covered with the ARC material of layer 22. During the second step, as the $CHF_3/CF_4/Ar$ chemistry etches TEOS $SiO_2$ much more faster than ARC material and because contact holes 20 and 21, are tapered, the ARC material acts as a mask and blocks etching of the TEOS $SiO_2$ material of layer 15, at their close proximity. As a result, TEOS $SiO_2$ fences 26, remain around ARC filled contact holes 20 and 21, and depressions 27, are also are created at these locations as visible in FIG. 2H. The same particularities occur in the array region as apparent in the left part of FIG. 2H. It can be also noticed that because the chemistry of this second step is unable to etch polysilicon stud 17, the latter is higher than the bottom of land recess 24 (M0 level).

One important thing is that CD contact holes 21, the silicon bottom surface of which is not protected, are partially attacked during the second step, so that, at these locations as apparent in FIG. 2H, the silicon material of the P+ diffusion region 12B, has been completely removed. Such a defect has a great importance for IGFET device functionality.

At this stage of the process, the remaining ARC and photo resist materials of layers 22 and 23, are removed using a conventional strip process. Then, referring to FIG. 2I, a 25 nm thick dual adhesion layer 28, of titanium/titanium nitride (Ti/TiN) forming a liner is deposited onto the wafer by sputtering. This is followed by the blanket deposition of a tungsten (W) layer 29, by chemical vapor deposition (CVD). Next, the wafer is chem-mech polished with an adequate slurry to remove the tungsten and titanium/titanium nitride in excess. As a final result, a planar silicon structure 10, provided with M0 tungsten lands 29, is produced as shown in FIG. 2I. As apparent in FIG. 2I, polysilicon stud 17, cause a thinning of the M0 tungsten land 29, in the array area (not true in the support area), thereby degrading its electrical resistance.

Fences 26 and depressions 27, around contact holes 16, 20 and 21, can cause a discontinuity in the 25 nm Ti/TiN thick liner 28. As a consequence, Ti silicidation is incomplete, leading thereby to the alteration of the resistance between the polysilicon stud 17, and metal land 29. In addition, fences 26, create stresses in the M0 tungsten lands 29, at CG and CD contact holes 20 and 21, which in turn, cause reliability failures.

PURPOSES AND SUMMARY OF THE INVENTION

The invention is basically a novel method of forming contacts and metal lands at the first level of metallization wherein the M0 photolithography and etch steps are performed prior to the CS photolithography and etch steps.

Therefore, one purpose of this invention is to provide a method of forming contacts and metal lands at the first level of metallization (M0) that improves metal contact and land/diffusion region interface.

Another purpose of this invention is to provide a method of forming contacts and metal lands at the first level of metallization (M0) that is not sensitive to ARC planarization before M0 etch.

Still another purpose of this invention is to have a method of forming contacts and metal lands at the first level of metallization (M0) that prevents P+ diffusion region erosion during M0 etch process which is detrimental to the CS contact resistance.

Yet another purpose of this invention is to provide a method of forming contacts and metal lands at the first level (M0) of metallization that prevents WSIX erosion during the M0 etch process which is detrimental to the CG contact resistance.

Still yet another purpose of the invention is to provide a method of forming contacts and metal lands at the first level of metallization (M0) which prevents boron out diffusion from P+ diffusion region during M0 etch process which is detrimental to its resistivity.

Yet another purpose of the present invention to provide a method of forming contacts and metal lands at the first level of metallization (M0) with a non-selective chemistry.

It is still another purpose of the present invention to provide a method of forming contacts and metal lands at the first level of metallization (M0) with a non selective chemistry wherein the CB recess over etching step is no longer necessary.

Still yet another purpose of the present invention to provide a method of forming contacts and metal lands at the first level of metallization (M0) with a non selective chemistry which eliminates SiO2 fences and depressions around the M0 land recesses for increased reliability.

It is still another purpose of the present invention to provide a method of forming contacts and metal lands at the first level of metallization (M0) with a non selective chemistry that produces M0 land recesses with uniform depth and size to ensure a better liner continuity improving M0 metal land electrical resistivity.

Yet another further purpose of the present invention to provide a method of forming contacts and metal lands at the first level (M0) with a non selective chemistry which etches doped polysilicon, ARC and TEOS materials at substantially the same rate.

It is another further purpose of the present invention to provide a method of forming contacts and metal lands at the first level of metallization (M0) with a non selective chemistry that widens the process window at the M0 photolithography level and improves throughput.

Therefore, in one aspect this invention comprises a method of forming contacts and metal lands onto a semiconductor structure at the first level of metallization (M0) comprising the steps of:

(a) having a silicon substrate with diffusion regions formed therein and a plurality of gate conductor stacks consisting of a composite doped polysilicon/refractory metal/silicon nitride ($Si_3N_4$) layer thereon; said structure being passivated by at least one insulating layer;

(b) forming at least one contact hole of a first type (CB contact hole) through said at least one insulating layer to expose at least a portion of at least one diffusion region of said substrate;

(c) filling said CB contact hole and exposing a diffusion region with doped polysilicon to form at least one conductive stud therein, wherein said stud being substantially coplanar with the exposed surface of said insulating layer;

(d) forming a first mask (M0 mask) on an exposed surface of said structure to expose at least one land recess and at least one of said conductive studs;

(e) anisotropically dry etching said masked structure to create M0 land recesses in said insulating layer;

(f) removing said M0 mask;

(g) forming a second mask at the surface of said structure (CS mask) to expose desired contact hole locations of a second type in at least one of said M0 land recesses to form at least one CG contact hole and CD contact hole, wherein said CG contact hole is located above at least one gate conductor stack and said CD contact hole is located above at least one diffusion region;

(h) anisotropically dry etching the resulting masked structure to create at least one CD contact hole and at least one CG contact hole, such that at least a portion if at least one diffusion region and at least a portion of at least one refractory metal layer of at least one gate conductor stacks is exposed;

(i) removing said CS mask; and, (j) filling said M0 land recesses and said CD contact hole and said CG contact hole with at least one electrically conductive material such that the top surface of said electrically conductive material and said insulating material top surface are substantially coplanar.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Figure 1:
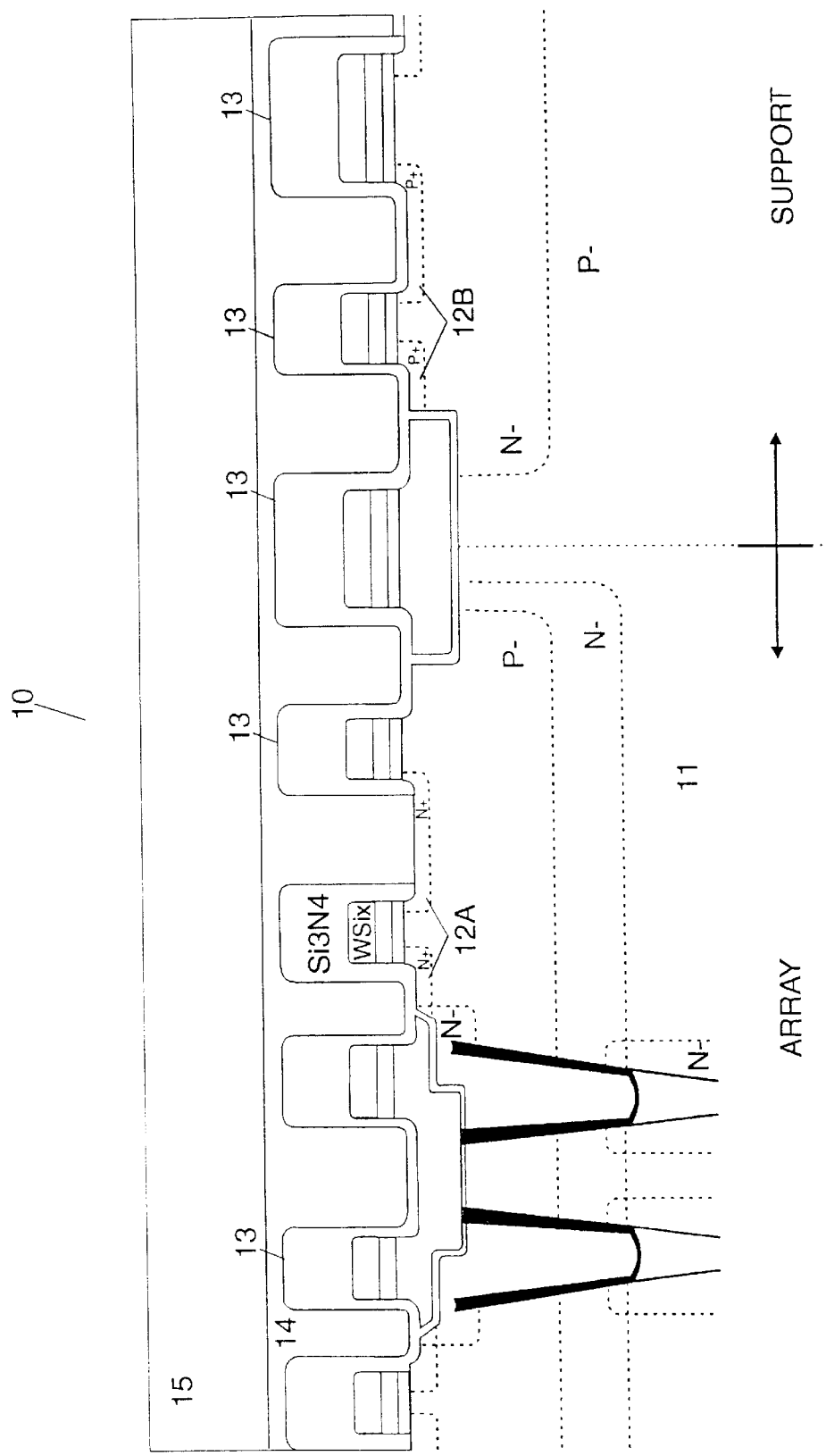
FIG. 1, shows a state-of-the-art silicon structure including diffusion (source/drain) regions and gate conductor stacks formed thereon that is coated with a dual bottom BPSG/top TEOS layer after planarization.

The inventors of this invention have discovered in a novel way that the conventional contact and metal land fabrication process described above by reference to FIG. 1 and FIGS. 2A–2I could be significantly improved. According to the present invention, the essential innovative points consist in the inversion of the M0 and CS masking (photolithography) and etching steps and in the use of a non-selective chemistry for the M0 etch step. As a result, one processing step is suppressed and the reliability problems (dimensional, resistivity, . . . ) mentioned above are eliminated. Note that like reference numerals (prime) are used throughout the several figures to designate identical (corresponding) parts.

Unlike the conventional fabrication process described above by reference to FIGS. 2A–2I, the improved process of the present invention starts by the M0 masking and etching steps.

The method of fabricating the contacts and metal lands according to the present invention will be now described by reference to FIGS. 3A–3F.

The starting structure is still the FIG. 1 structure 10, which basically consists of a silicon substrate 11, having diffusion regions 12, formed therein and gate conductor stacks 13, formed thereupon. Structure 10, is passivated by a dual BPSG/TEOS layer 14/15, which is well known in the art. The sequence of processing steps described above by reference to FIGS. 2A and 2B, is the same except in that there is no longer the over etching of the polysilicon stud 17, so that as clearly apparent in FIG. 3A, the top of the polysilicon stud 17, is substantially coplanar with the surface of the TEOS layer 15. This is an essential feature of the improved method of the present invention.

Now referring to 3B, the ARC layer 18', and the M0 photo resist mask 19', are formed. The photo resist of layer 19', is patterned to expose the ARC material at the M0 land locations.

Next, M0 land recesses will be formed. According to the present invention, the improved M0 etch step is based upon a non-selective chemistry to etch the doped polysilicon.

This step is performed in a RIE etcher, for instance using the MxP+ chamber of the AME 5200, a tool manufactured by Applied Materials Inc., Santa Clara, Calif., USA. Process parameters for the etching of the ARC, TEOS and doped polysilicon materials in a single step are given below. A $NF_3/CHF_3$ mixture (23/77 ratio) is adequate in all respects. This particular ratio offers the lowest selectivity. As a matter of fact, it etches the above cited materials at about 160 nm/min.

Following are some of the preferred operating conditions:

$NF_3$ Flow: 30 sccm $CHF_3$ Flow: 100 sccm

Pressure: 140 mTorr

RF Power: 600 W

Mag. Field: 0 Gauss

Wall Temp: 15° C.

Cath. Temp.: 15° C.

He Cooling: 14 Torr

Etch Time: 120 s.

Finally, the photo resist of M0 mask 20, is stripped by methods well known in the art.

Figure 2A:
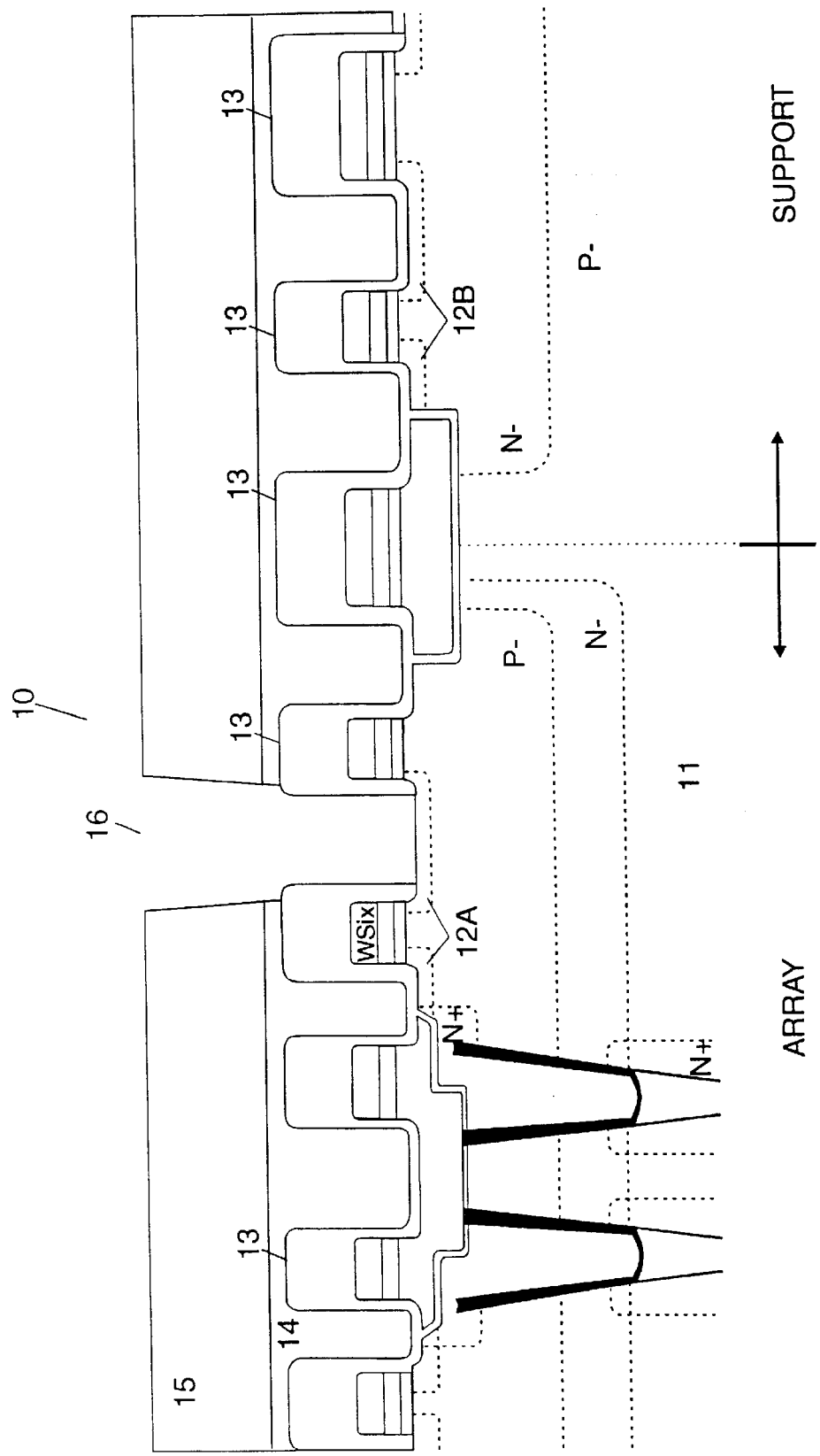
FIGS. 2A–2I, show the structure of FIG. 1 undergoing the sequence of steps of a conventional method of forming contacts and metal lands at the first level of metallization (M0).
Figure 2B:
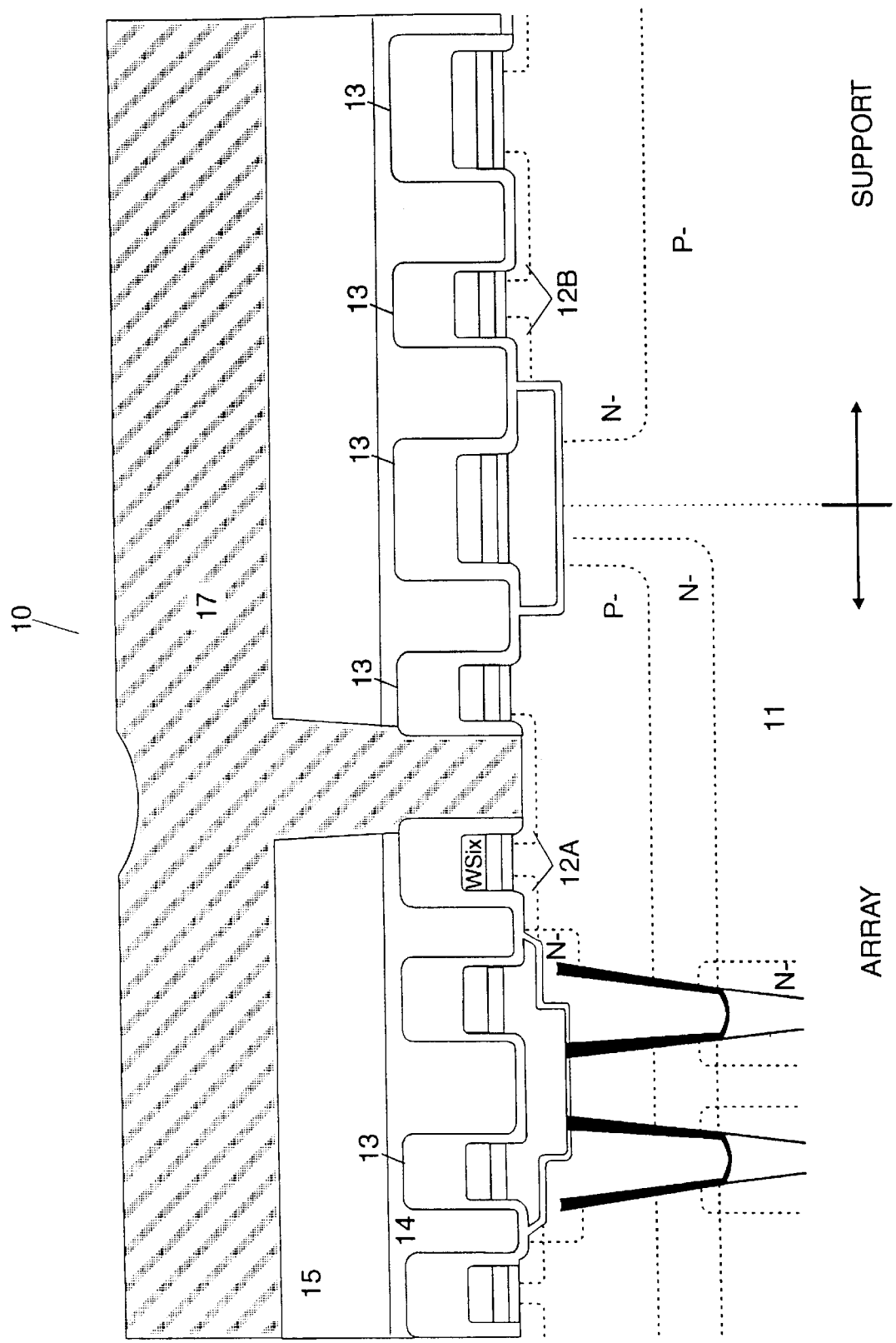
Figure 2C:
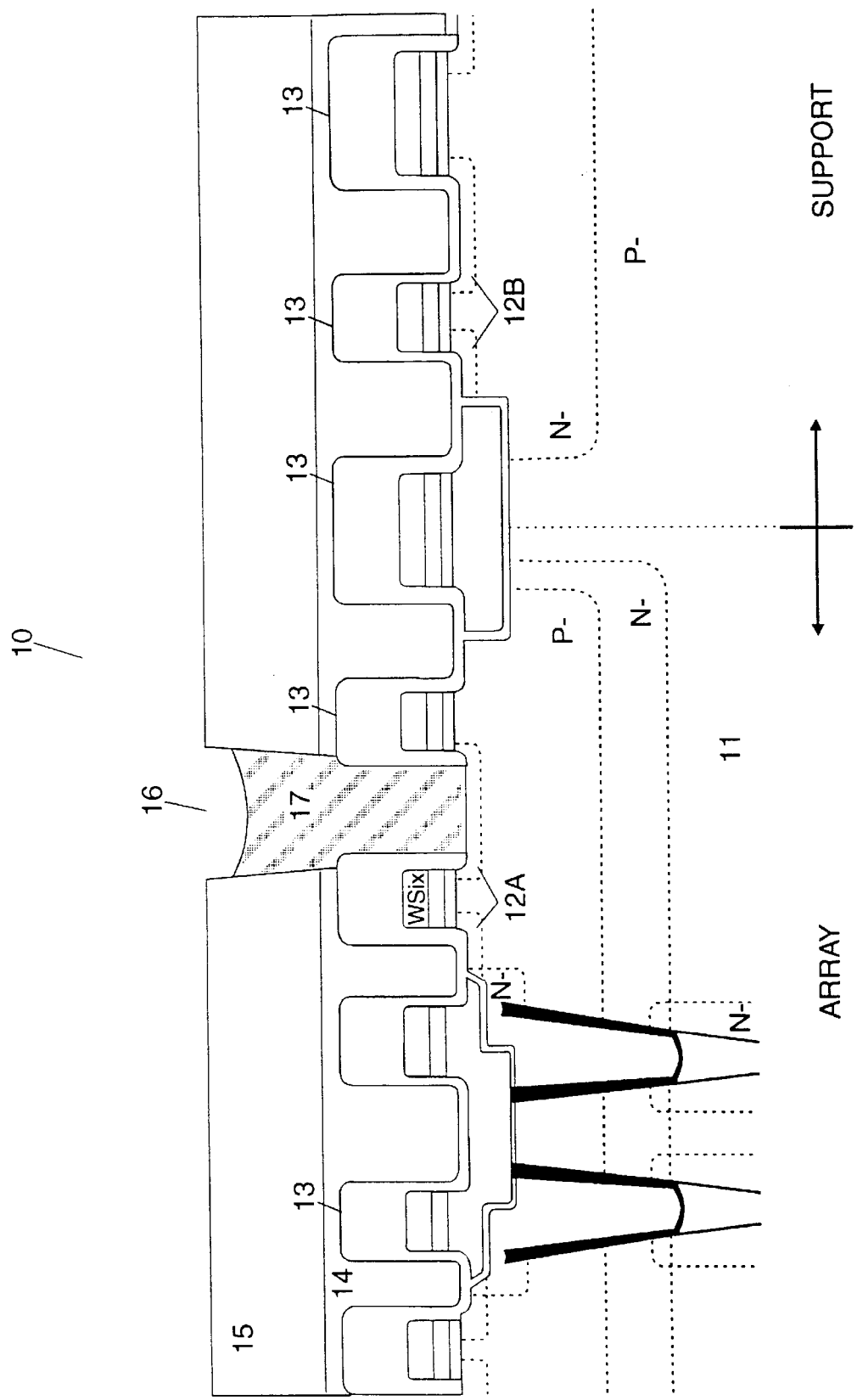
Figure 2D:
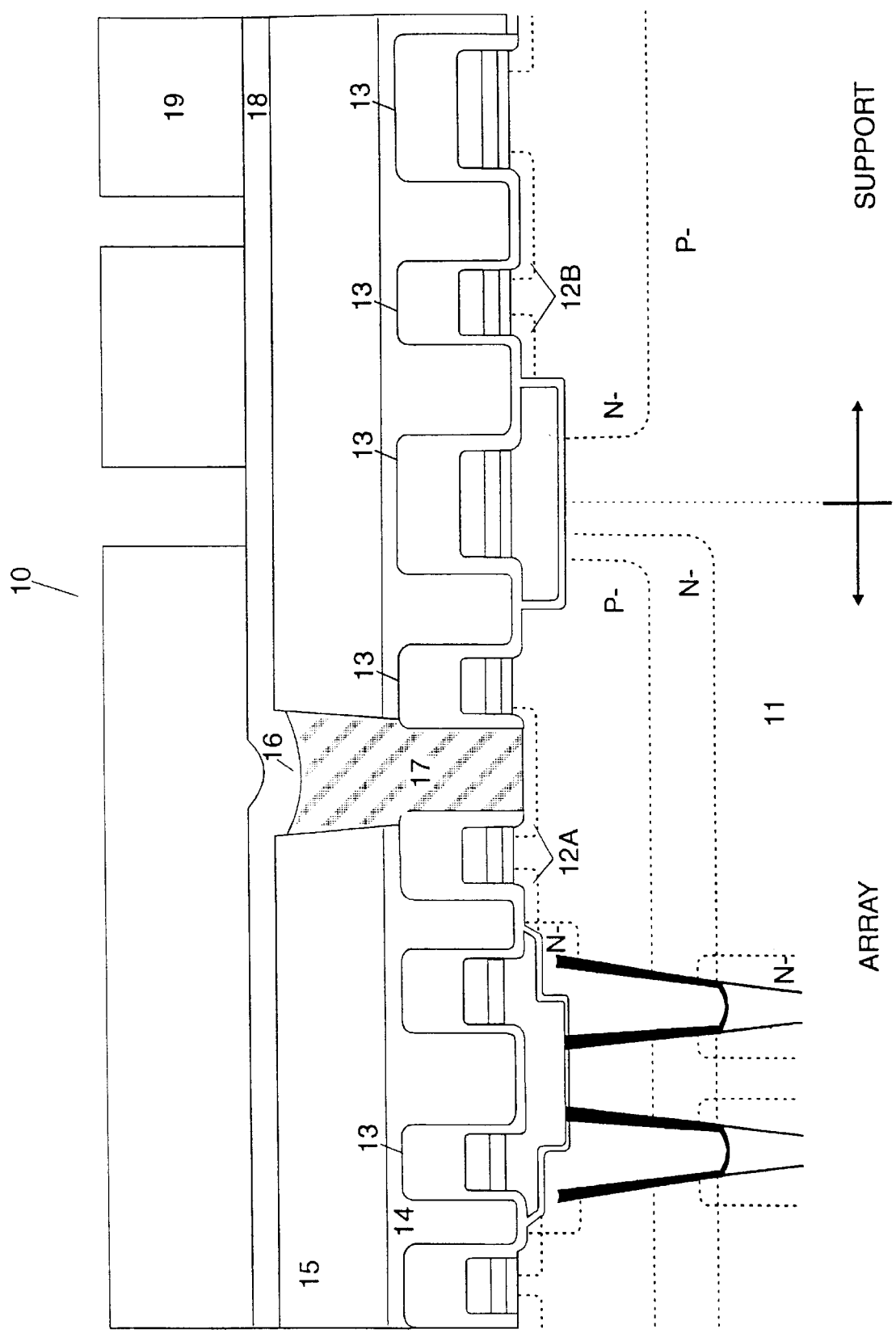
Figure 2E:
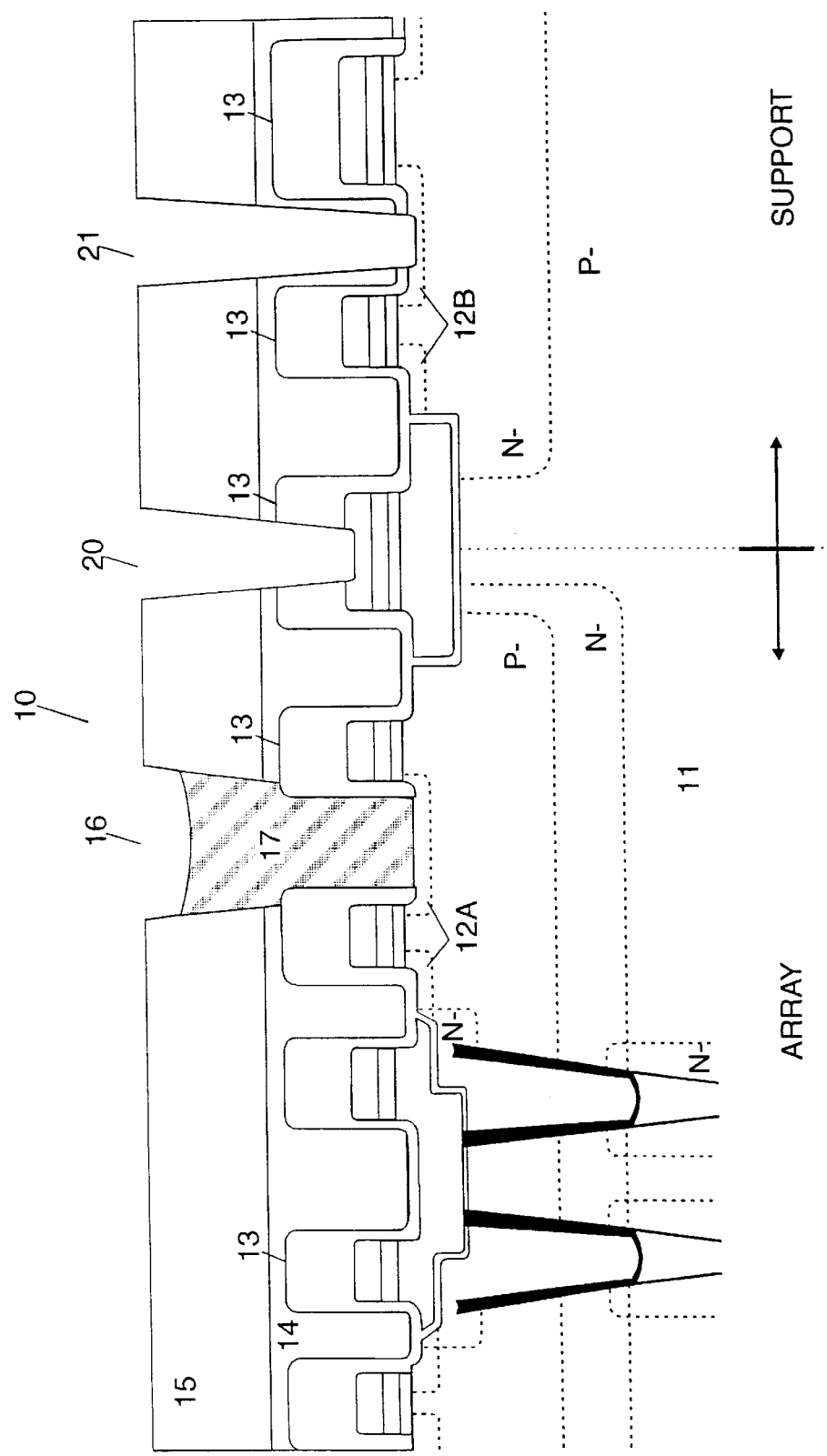
Figure 2F:
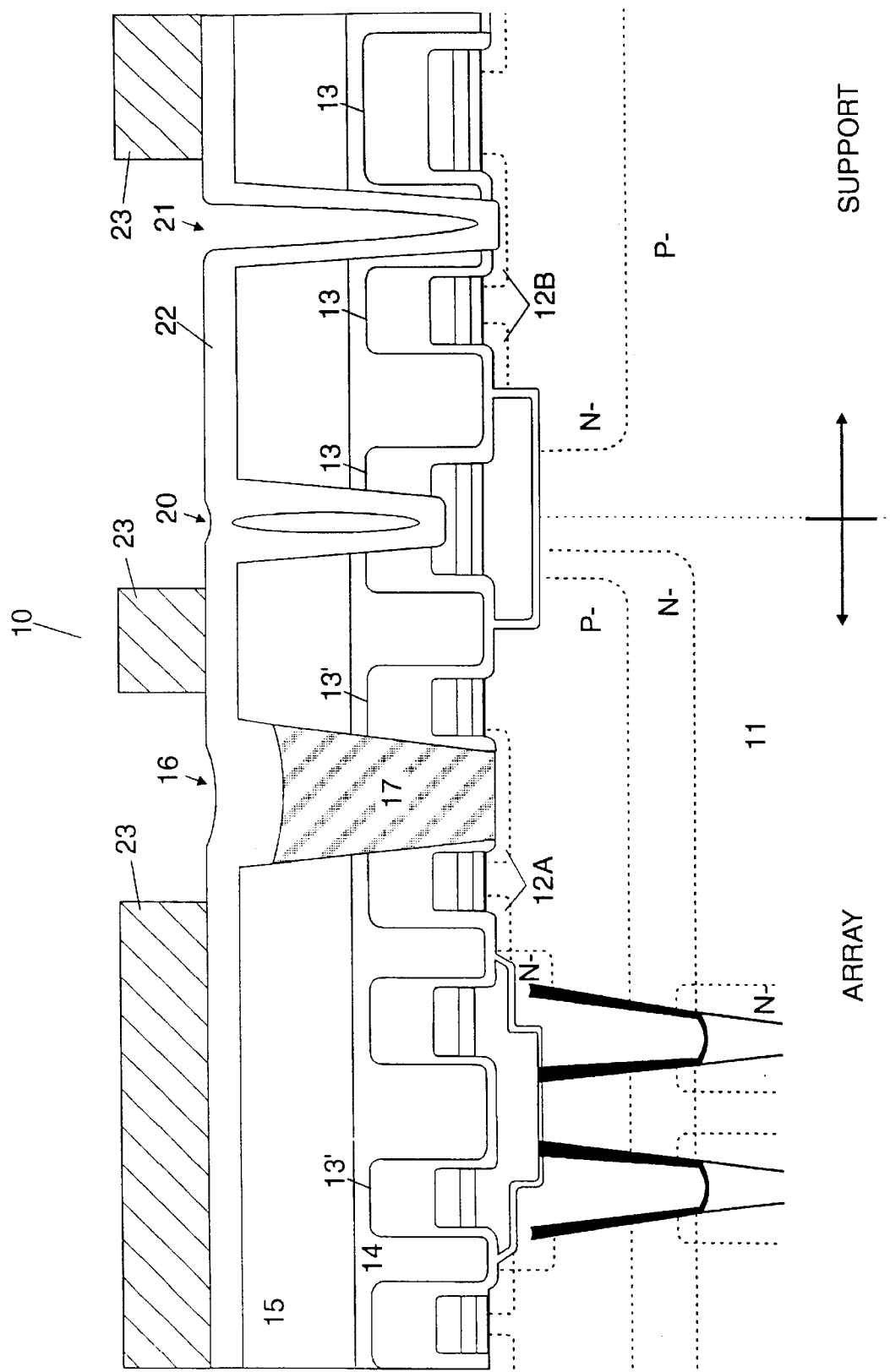
Figure 2G:
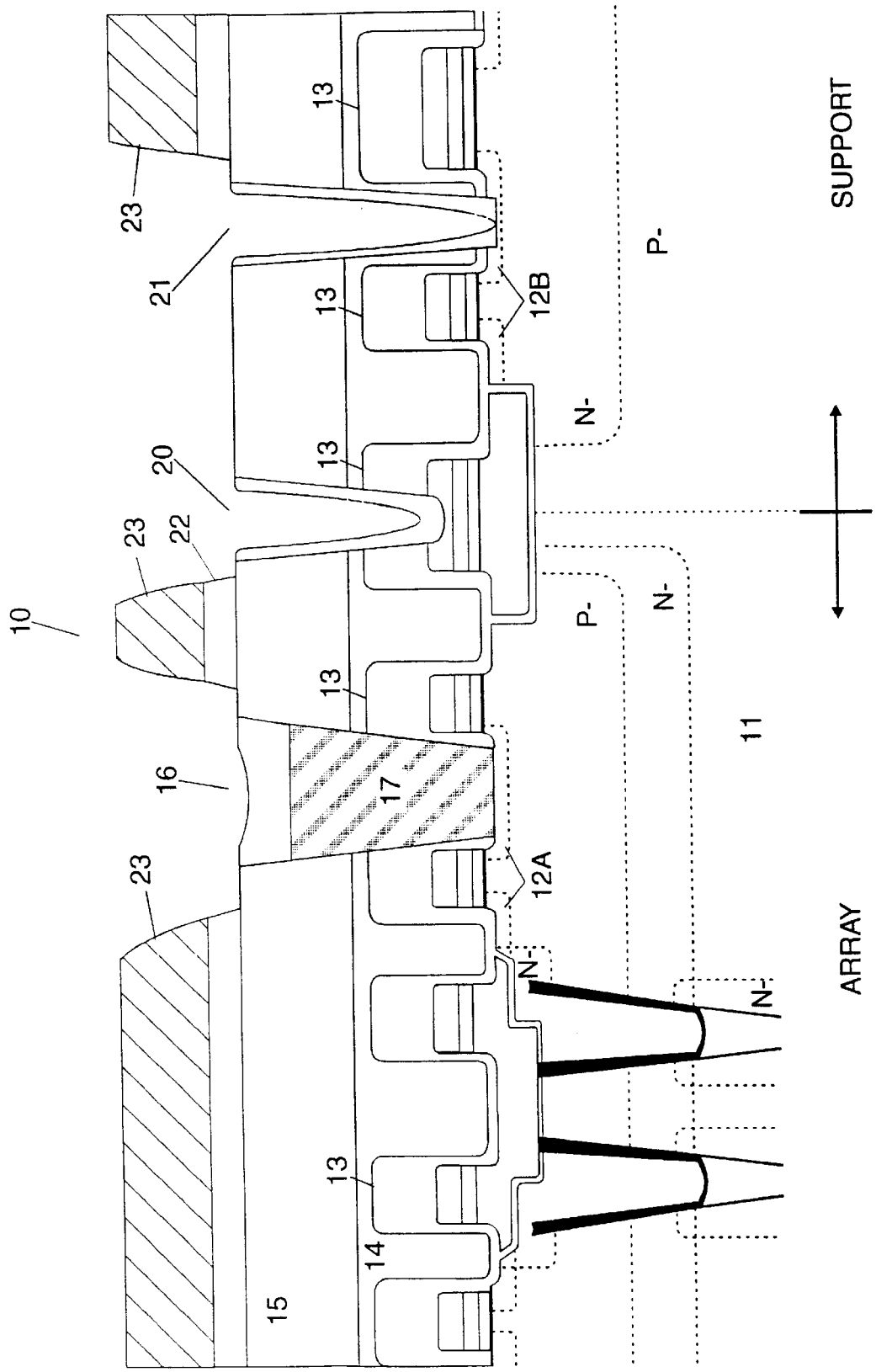
Figure 2H:
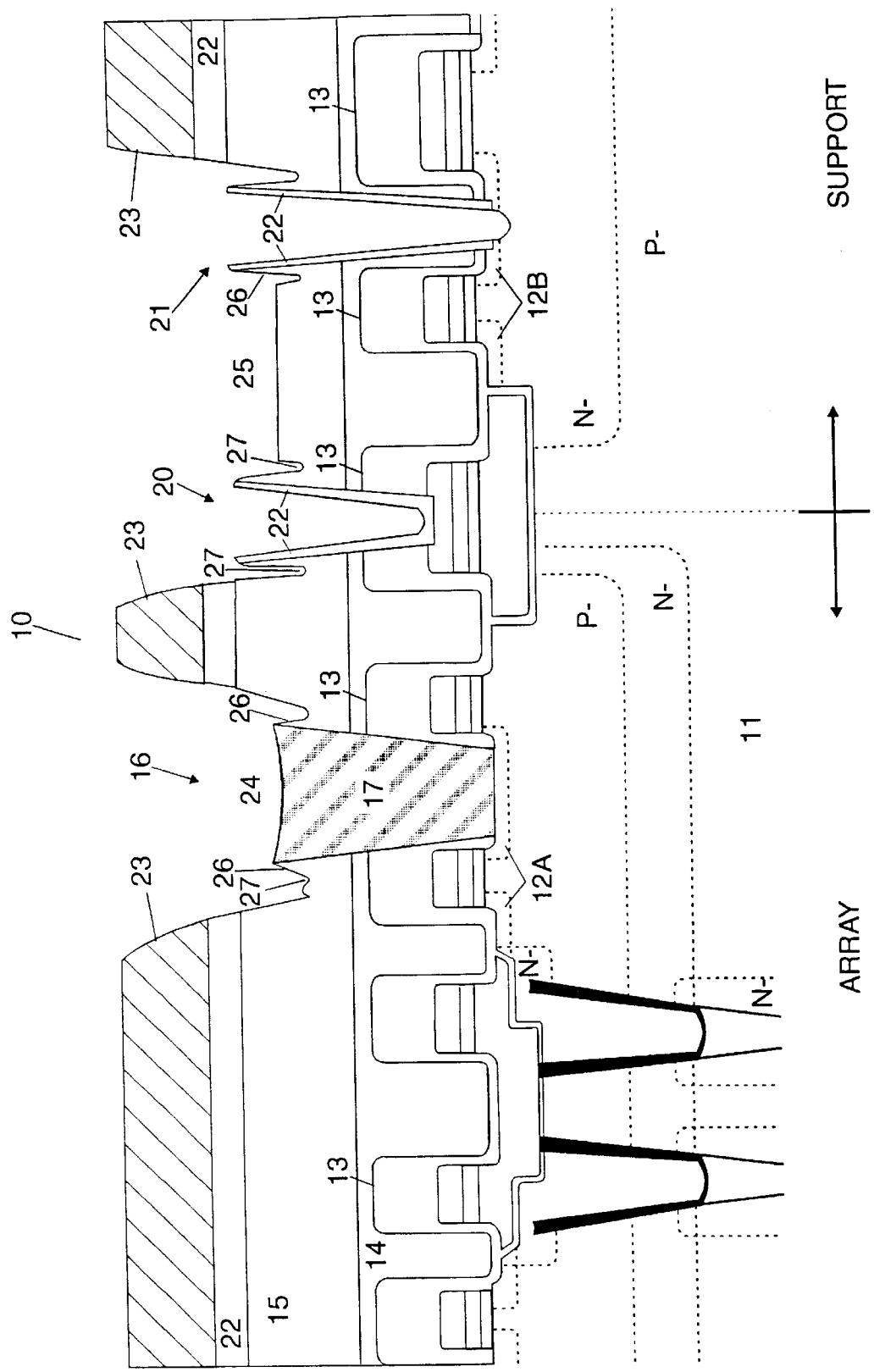
Figure 2I:
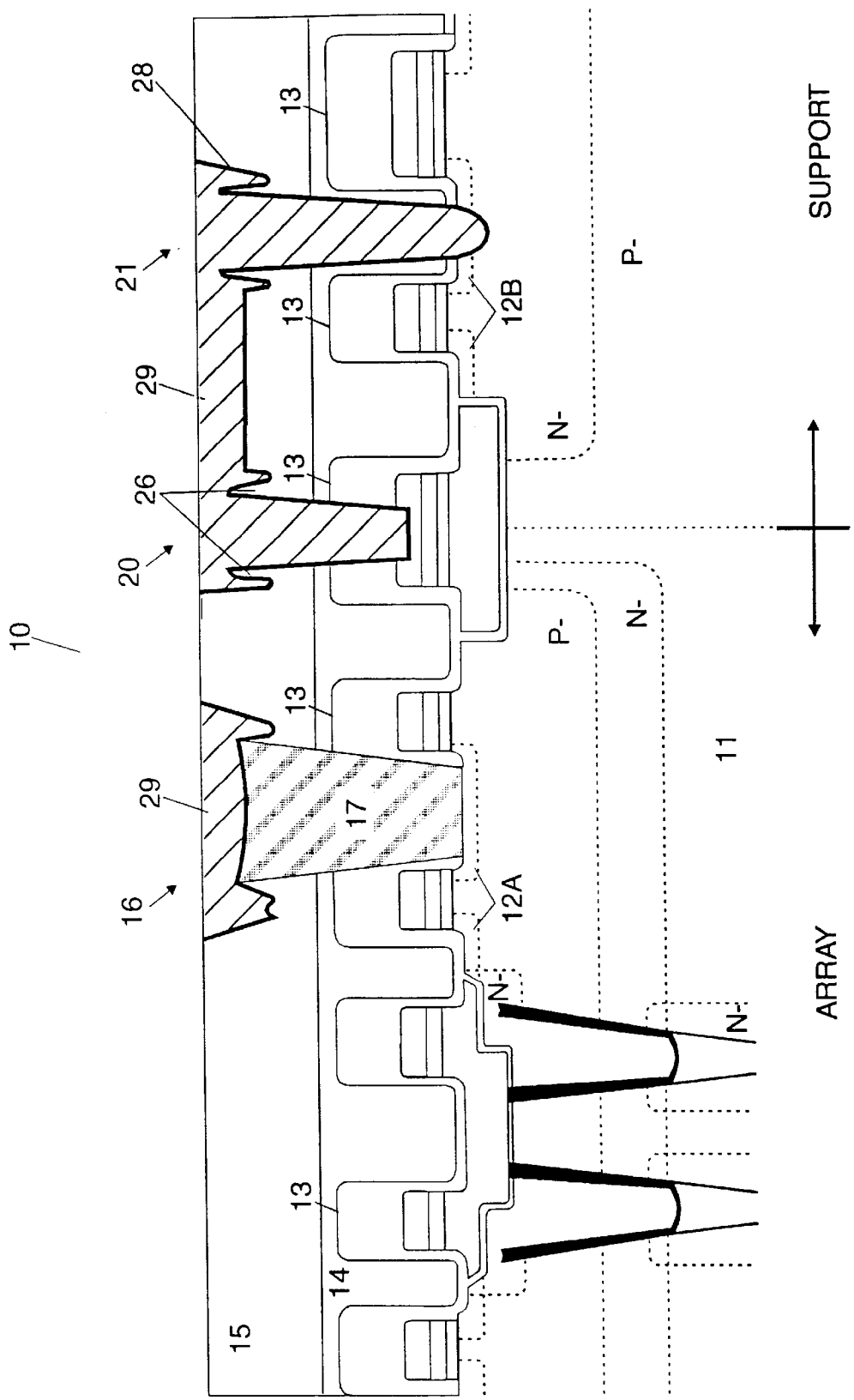

It has been experimentally demonstrated that to improve the process of etching the ARC layer 22, and the TEOS layer 15, (to produce the desired M0 land recesses with an uniform result), the chemistry must not be selective, i.e., it must be able to etch ARC, TEOS and doped polysilicon materials at the same rate. As a result, with such a chemistry, the step of etching the polysilicon stud 17, described by reference to FIG. 2C, is no longer necessary and openings in the M0 mask 23, are no longer tapered.

Figure 3A:
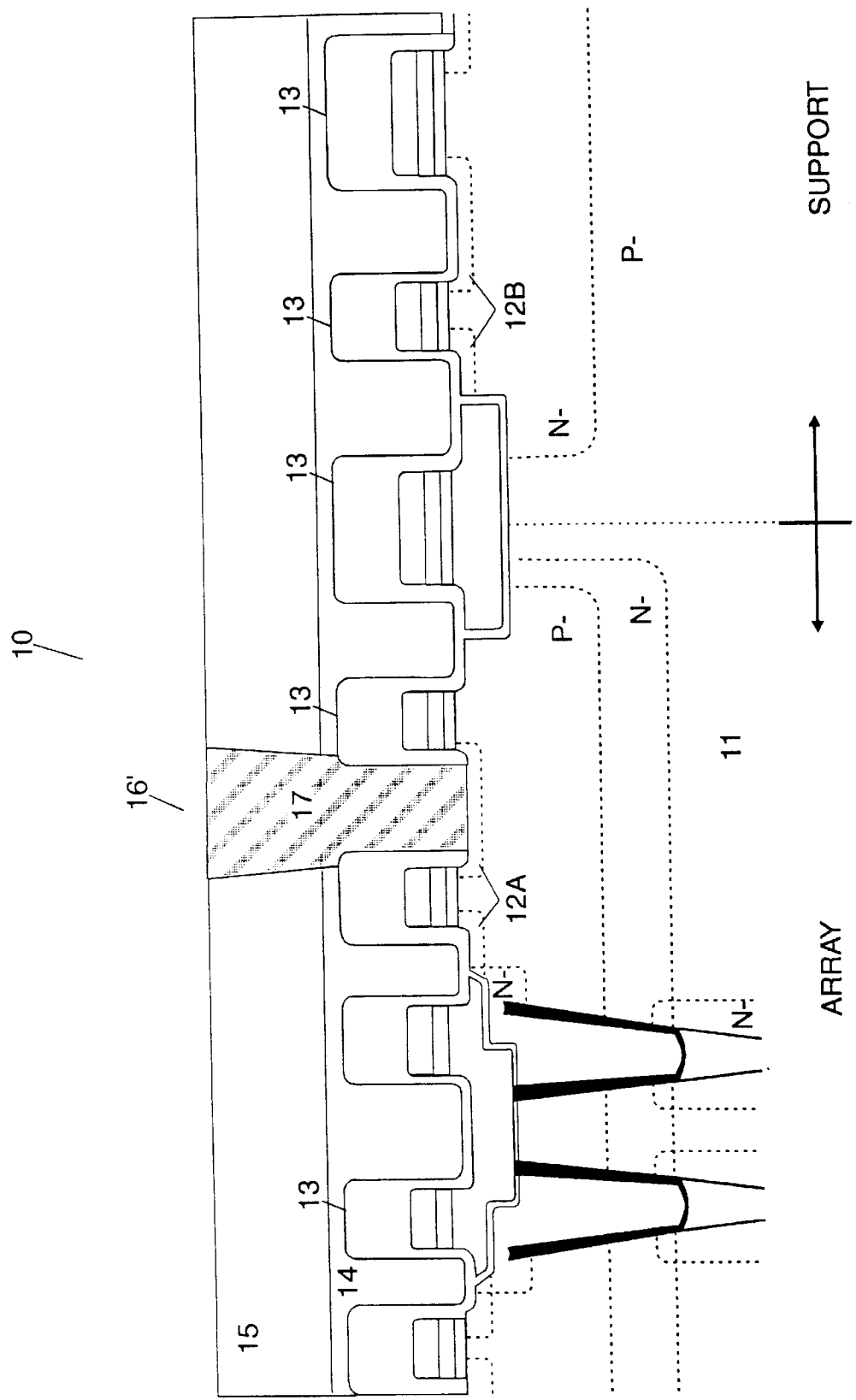
FIGS. 3A–3F, show the structure of FIG. 1, undergoing the sequence of steps of forming contacts and metal lands at a first level of metallization (M0) according to the method of the present invention.
Figure 3B:
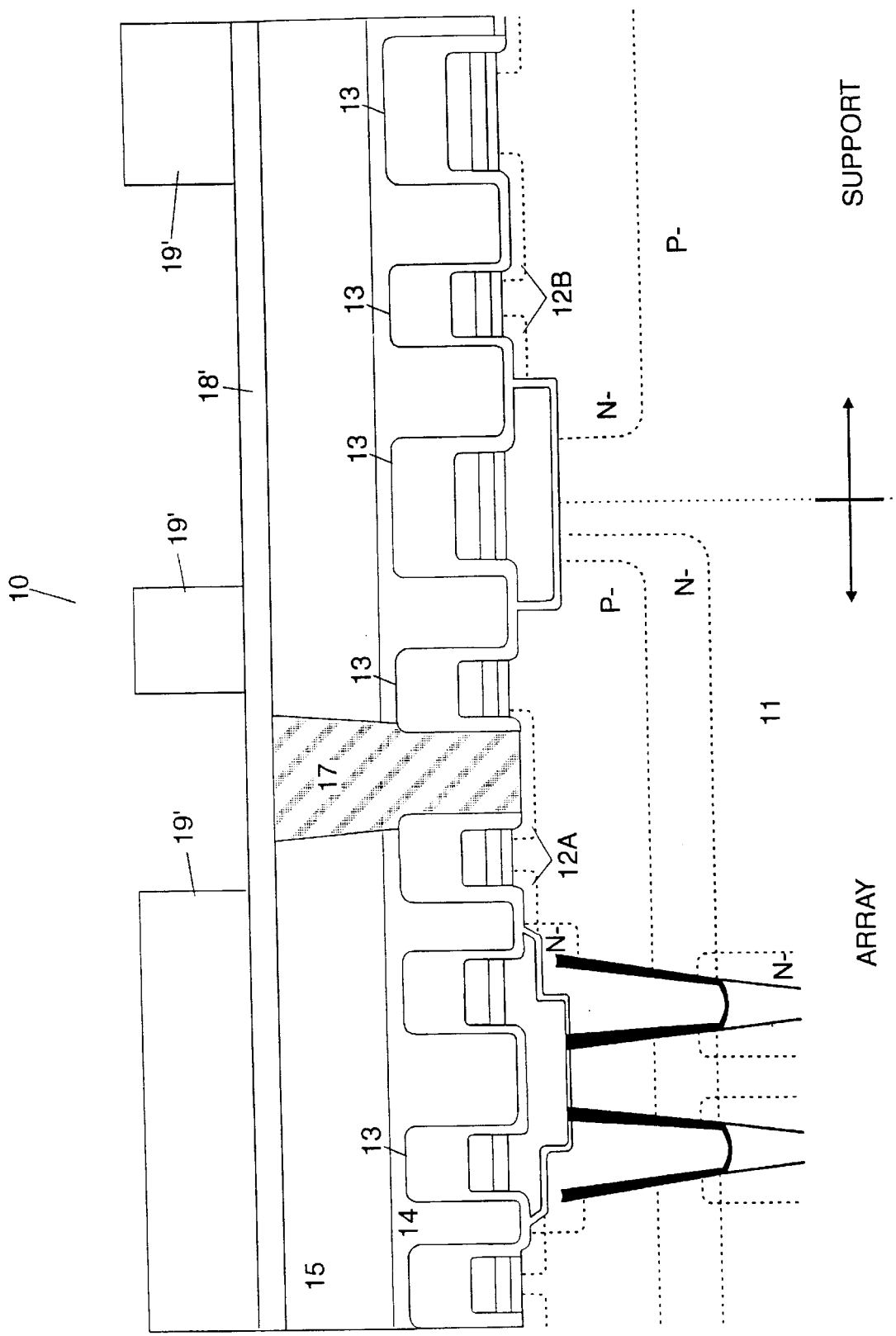
Figure 3C:
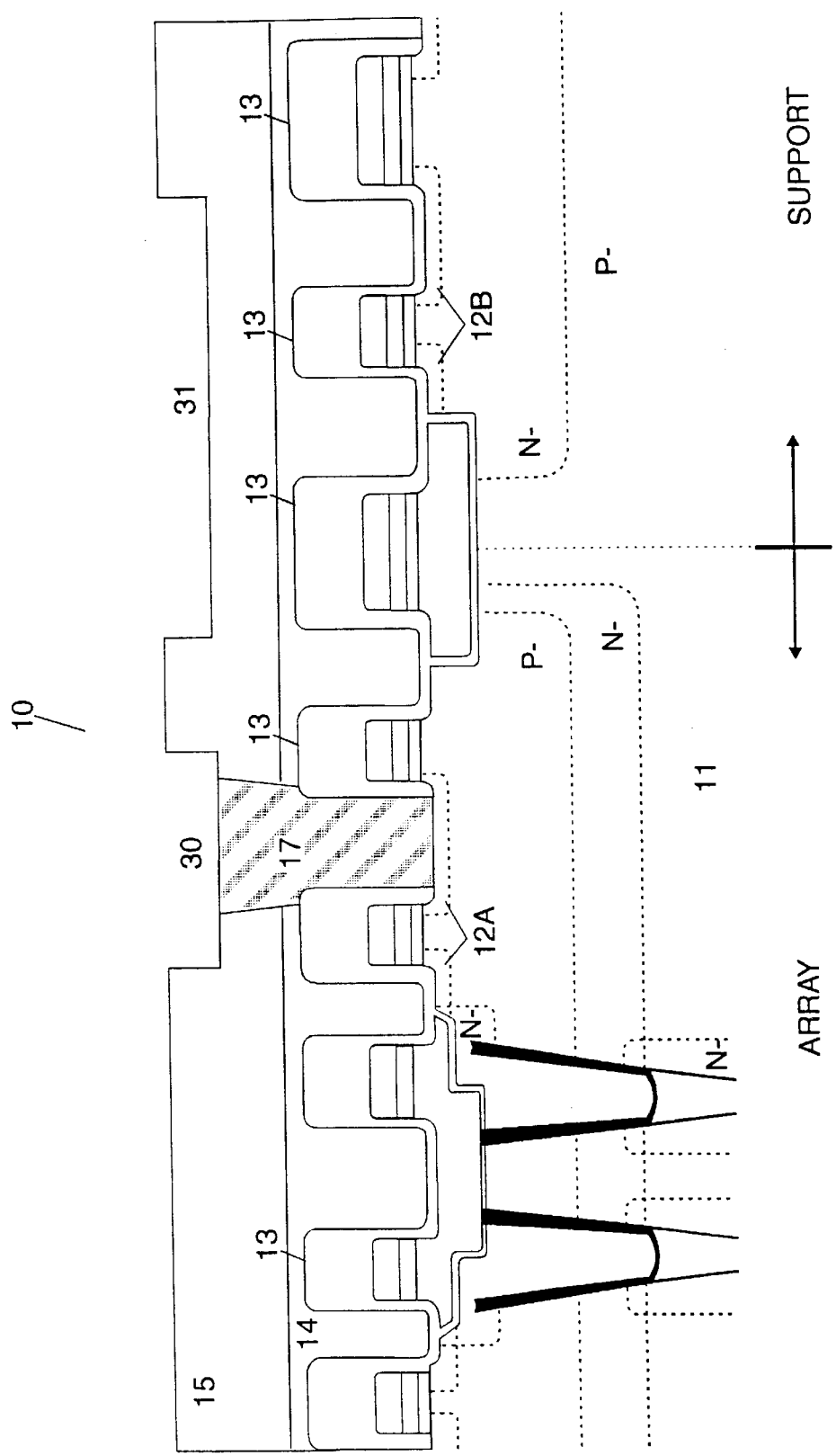

This chemistry performs the CB polysilicon recess with a high accuracy. Turning to FIG. 3C, M0 land recesses are referenced 30 and 31, depending upon whether they are located in the array or in the support area respectively. As clearly apparent in FIG. 3C, in the array area, polysilicon stud 17, top surface is substantially coplanar with the TEOS material in the M0 land recess bottom.

Figure 3D:
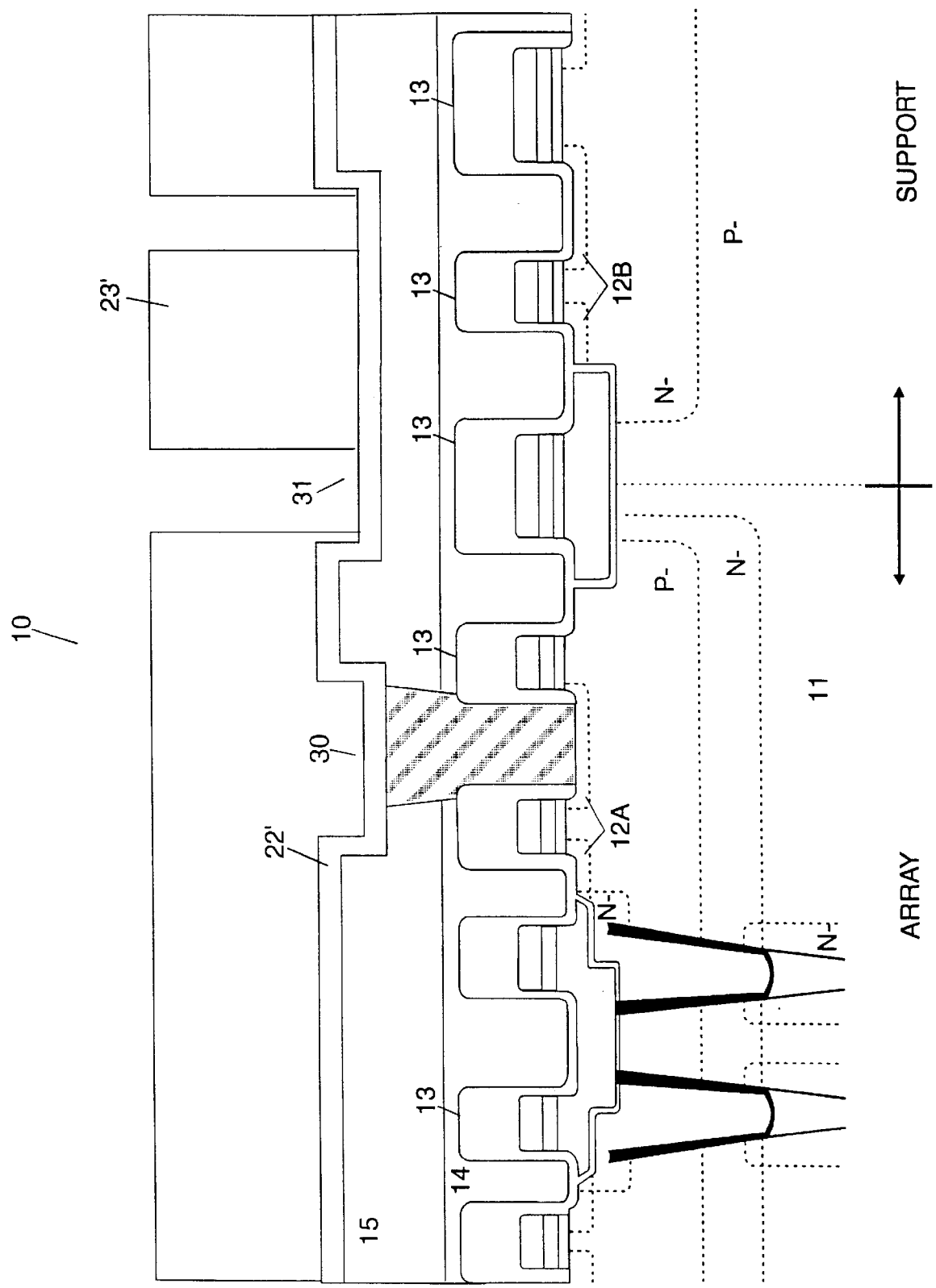

The fabrication process is continued with the CS photo-lithography and etch steps. Turning to FIG. 3D, an anti-reflective coating (ARC) layer 22', and a 850 nm thick photo resist layer 23', are conformally deposited onto structure 10, to coat land recesses 30 and 31. After deposition, the photo resist layer 23', is baked, exposed and developed as standard to leave a patterned layer, still referred as the CS mask referenced 23'. It is important to notice that CS mask 23', openings are only located above M0 land recesses in the support area.

Figure 3E:
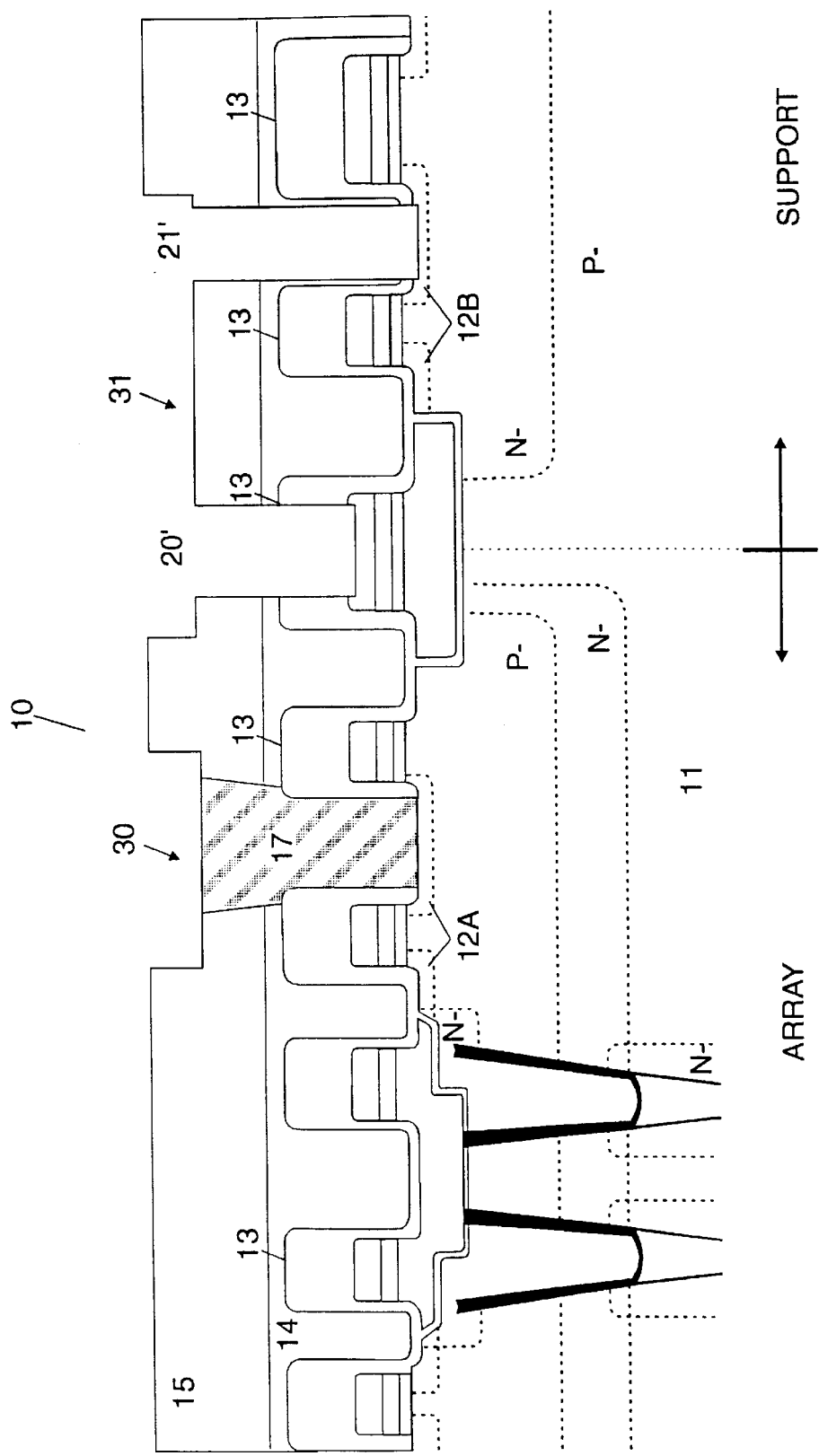

Now referring to FIG. 3E, contact holes 20' and 21', are etched through layers 22', 15, 14 and 13, in the support area at desired locations to expose gate conductor stacks of IGFETs and diffusion regions 12B, of the substrate 11, respectively. Contact holes are etched through a thinner stack because the TEOS layer 15, thickness has been reduced during the M0 etch step. This results in a bottom dimensional increase with same top dimensional. In addition, because M0 etch is already done, no new processing steps will affect P+ diffusion region 12B, which in turn, will maintain diffusion region integrity (and thus its resistivity) and moreover improves the CD contact/diffusion region 12B, interface resistance, increasing thereby the switching speed of IGFETs.

Figure 3F:
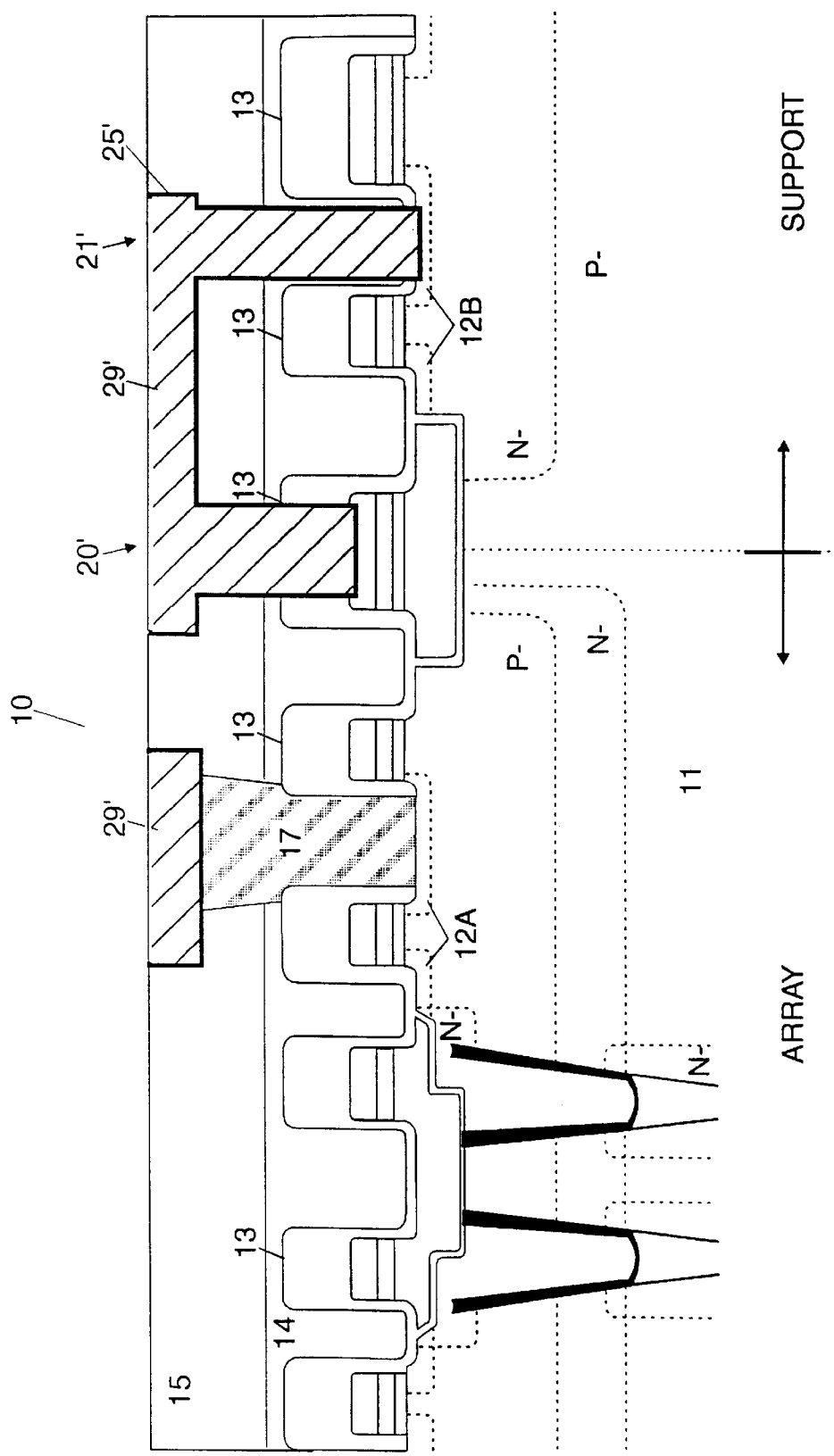

Then, a 25 nm thick dual adhesion layer of titanium/titanium nitride (Ti/TiN) forming a liner is deposited onto the wafer by sputtering. This is followed by the blanket deposition of a tungsten (W) layer by chemical vapor deposition (CVD). Next, the wafer is chem-mech polished with an adequate slurry to remove the tungsten and titanium/titanium nitride in excess. All these steps are performed as described above by reference to the conventional fabrication process. As a final result, a planar silicon structure provided with M0 tungsten contacts and lands 29', is produced as shown in FIG. 3F.

This new M0 etch step is thus able to provide M0 land recesses 30 and 31, with a perfectly planar bottom surface. Thus, after M0 recesses have been filled with tungsten as described above by reference to FIG. 3F, at the end of the fabrication process, M0 tungsten land electrical resistivity is significantly lowered improving thereby the switching speed of IGFETs. Moreover, fences and depressions are eliminated and the polysilicon stud 17, is now etched in such a manner that there is a great depth uniformity of the M0 land recesses 30, across the whole wafer. Because M0 and CS masking and etching steps are inverted, CS contact holes are no longer subject to over etching, the resulting CD contact with diffusion regions 12B, have no longer resistance related problems.

As one can clearly see that the method of the present invention allows a perfect control of M0 metal land dimensional and resistivities and CS contact dimensional and resistances.

Additionally, the method of the present method produces M0 land recesses with a high depth and size uniformity across the wafer, so that the resulting M0 metal lands have no longer electrical resistivity related problems. In addition, because M0 and CS photolithography and etch steps are inverted, CS contact holes are no longer exposed to over etching, so that the resulting CS contacts have no longer resistance related problems.

In one of the method of this invention the step of forming a first mask (M0 mask) could comprise a step of depositing a dual layer of a bottom anti-reflective coating (ARC) material and a top photo resist material onto the structure which is exposed and developed to form the first mask; and the step of anisotropically dry etching the masked structure could comprise the use of a non-selective chemistry which etches doped polysilicon, ARC and insulating materials at substantially the same rate. The non-selective chemistry could comprise a $NF_3/CHF_3$ mixture, wherein the $NF_3/CHF_3$ mixture ratio is preferably 23/77.

For some applications it is preferred that the insulating material is a dual boro-phospho-silicate-glass (BPSG) and tetra-ethyl-ortho-silicate (TEOS) layer, and that the electrically conductive material is a metal.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of forming contacts and metal lands onto a semiconductor structure at the first level of metallization comprising the steps of:

(a) providing a silicon substrate with diffusion regions formed therein and a plurality of gate conductor stacks comprising a composite doped polysilicon/refractory metal/silicon nitride layer thereon, said structure being passivated by at least one insulating layer;

(b) forming at least one contact hole of a first type through said at least one insulating layer to expose at least a portion of at least one diffusion region of said substrate;

(c) filling said contact hole of the first type and exposing a diffusion region with doped polysilicon to form at least one conductive stud therein, said stud being substantially coplanar with the exposed surface of said insulating layer;

(d) forming a first mask on an exposed surface of said structure to expose at least one land recess location and at least one of said conductive studs;

(e) anisotropically dry etching said masked structure to create land recesses in said insulating layer;

(f) removing said mask;

(g) forming a second mask at the surface to said structure to expose desired contact hole locations of a second type in at least one of said land recesses to form at least one contact hole of a second type and at least one contact hole of a third type, wherein said contact hole of the second type is located above at least one gate conductor stack and said contact hole of the third type is located above at least one diffusion region;

(h) anisotropically dry etching the resulting masked structure to create at least one contact hole of the second type and at least one contact hole of the third type, such that at least a portion of at least one diffusion region and at least a portion of at least one refractory metal layer of at least one gate conductor stack is exposed;

(i) removing said second mask; and (j) filling said land recesses and said contact hole of the second type and said contact hole of the third type with at least one electrically conductive material such that the top surface of said electrically conductive material and said insulating material top surface are substantially coplanar.

2. The method of claim 1, wherein said step of forming a first mask comprises the steps of depositing a dual layer of a bottom anti-reflective coating material and a top photo resist material onto said structure, and exposing and developing said top photo resist material to form said first mask.

3. The method of claim 2, wherein, in step (e), said masked structure is anisotropically dry etched using a non-selective chemistry comprising a $NF_3/CHF_3$ mixture.

4. The method of claim 3, wherein the $NF_3/CHF_3$ ratio is 23/77.

5. The method of claim 1, wherein said at least one insulating layer is a dual boro-phospho-silicate-glass and tetra-ethyl-ortho-silicate layer.

6. The method of claim 1, wherein said at least one insulating layer comprises a material selected from the group consisting of boro-phospho-silicate-glass and tetra-ethyl-ortho-silicate.

7. The method of claim 1, wherein, in step (e), said masked structure is anisotropically etched under the following approximate preferred operating conditions:

$NF_3$ Flow: 30 sccm
$CHF_3$ Flow: 100 sccm
Pressure: 140 mTorr
RF Power: 600 W
Mag. Field: 0 Gauss
Wall Temp: 15° C.
Cath. Temp.: 15° C.
He Cooling: 14 Torr
Etch Time: 120 s.

8. The method of claim 1, wherein said electrically conductive material is a metal.

9. The method of claim 1, wherein said electrically conductive material is selected from the group consisting of titanium, titanium nitride and tungsten.

10. The method of claim 1, further comprising, prior to step (d), the step of depositing an anti-reflective coating on said insulating layer and said at least conductive stud.

11. The method of claim 1, wherein, in step (e), said masked structure is anisotropically dry etched using a non-selective chemistry which etches doped polysilicon, anti-reflective coating and insulating materials at substantially the same rate.

12. The method of claim 3, wherein said non-selective chemistry comprises a $NF_3/CHF_3$ mixture at a $NF_3$ flow rate of about 30 sccm and a $CHF_3$ flow rate of about 100 sccm.

13. The method of claim 1, wherein said plurality of gate conductor stacks consist of a composite doped polysilicon/refractory metal/silicon nitride layer.

* * * * *